US012754516B2

(12) United States Patent
Darvishian et al.

(10) Patent No.: US 12,754,516 B2
(45) Date of Patent: Oct. 6, 2026

(54) PHYSICS PACKAGE FOR CHIP SCALE ATOMIC CLOCKS AND METHOD OF MAKING SAME

(71) Applicant: Microchip Technology Incorporated, Chandler, AZ (US)

(72) Inventors: Ali Darvishian, Lynn, MA (US); Peter Cash, Lynnfield, MA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/981,085

(22) Filed: Dec. 13, 2024

(65) Prior Publication Data

US 2026/0110989 A1 Apr. 23, 2026

Related U.S. Application Data

(60) Provisional application No. 63/708,604, filed on Oct. 17, 2024.

(51) Int. Cl.
*G04F 5/16* (2006.01)
*H03L 7/26* (2006.01)

(52) U.S. Cl.
CPC . *G04F 5/16* (2013.01); *H03L 7/26* (2013.01)

(58) Field of Classification Search
CPC ........ G04F 5/16
USPC ........ 331/94, 1
See application file for complete search history.

(56) References Cited

U.S. PATENT DOCUMENTS 9,312,869 B2 * 4/2016 Kriz ........ H03L 7/26
12,160,242 B1 * 12/2024 Autry ........ H01S 5/02375
2013/0052405 A1 * 2/2013 Youngner ........ G04F 5/14 428/116

* cited by examiner

*Primary Examiner* — Joseph Chang
(74) *Attorney, Agent, or Firm* — Shumaker, Loop & Kendrick, LLP; Ryan M. Corbett

(57) ABSTRACT

A physics package for chip scale atomic clocks is provided. The physics package may include a first Low-Temperature Co-fired Ceramic (LCC) pad, a first suspension coupled to the first LCC pad, a core coupled to the first suspension, a second suspension coupled to the core and coupled to the first suspension to encapsulate the core, and a second LCC pad coupled to the second suspension and coupled to the first LCC pad to encapsulate the first suspension, the core, and the second suspension. The core may be manufactured using a wafer level fabrication process.

20 Claims, 7 Drawing Sheets

PHYSICS PACKAGE FOR CHIP SCALE ATOMIC CLOCKS AND METHOD OF MAKING SAME

CROSS-REFERENCE TO RELATED APPLICATION

The present application claims priority to U.S. Provisional Patent Application No. 63/708,604, entitled: Physics Package for Chip Scale Atomic Clocks and Method of Making Same, filed on Oct. 17, 2024, the contents of which are hereby incorporated by reference in their entirety.

TECHNICAL FIELD

The present disclosure relates generally to chip scale atomic clocks, and more specifically to a physics package for chip scale atomic clocks, and a method for manufacturing said physics package using a wafer level fabrication process.

SUMMARY

According to an aspect of one or more examples, there is provided a physics package for chip scale atomic clocks. The physics package may include a first Low-Temperature Co-fired Ceramic (LCC) pad, a first suspension on the first LCC pad, a core on the first suspension, a second suspension on the core and coupled to the first suspension to encapsulate the core, and a second LCC pad deposited on the second suspension and coupled to the first LCC pad to encapsulate the first suspension, the core, and the second suspension. The core may be manufactured using a wafer level fabrication process. At least one of the first suspension and the second suspension may be constructed using flexible electronics technology. At least one of the first suspension and the second suspension may be made of polyimide. The second suspension may include a thin polyimide sheet in a middle of a top surface of the second suspension.

According to an aspect of one or more examples, there is provided a core of a physics package for chip scale atomic clocks. The core may include a first silicon wafer, a first glass wafer bonded to the first silicon wafer, a second glass wafer bonded to the first silicon wafer, a second silicon wafer bonded to the first glass wafer, a third glass wafer bonded to the second silicon wafer, a laser source attached to the third glass wafer, the laser source to emit laser light, and a photodetector wafer bonded to the second glass wafer, the photodetector to output an output signal based on a measured intensity of the laser light. The core may be arranged along a horizontal axis in the physics package. The laser source may be a Vertical Cavity Surface Emitting Laser (VCSEL). An input signal may be supplied to the laser source through a LCC pad, and the output signal may be supplied from the photodetector to control electronics through the LCC pad, the control electronics to determine a frequency of atomic transitions. At least one of the first glass wafer and the third glass wafer may include a metasurface optical component. The metasurface optical component may convert the laser light from a Gaussian beam to a flat-top beam. The metasurface optical component may be tuned to manipulate at least one of a phase, wavelength, amplitude, and polarization of the light. The bonded first silicon wafer, first glass wafer, and second glass wafer may form an atomic cell that contains a vapor of alkali atoms to interact with the laser light. The alkali atoms may be cesium, rubidium, or lithium.

According to an aspect of one or more examples, there is provided a method of manufacturing a core of a physics package for chip scale atomic clocks. The method may include etching a first silicon wafer, bonding the first silicon wafer to a first glass wafer, bonding a second glass wafer to the first silicon wafer, etching a second silicon wafer, bonding the second silicon wafer to a third glass wafer, bonding the second silicon wafer to the first glass wafer, bonding a photodetector wafer to the second glass wafer, attaching a laser source to the third glass wafer, the laser source to emit laser light, and dicing the bonded silicon and glass wafers into individual physics packages. The core may be arranged along a horizontal axis in the physics package. The laser source may be a Vertical Cavity Surface Emitting Laser (VCSEL). At least one of the first glass wafer and the third glass wafer may include a metasurface optical component. The metasurface optical component may convert the laser light from a Gaussian beam to a flat-top beam. The metasurface optical component may be tuned to manipulate at least one of a phase, wavelength, amplitude, and polarization of the laser light. The bonded first silicon wafer, first glass wafer, and second glass wafer may form an atomic cell that contains a vapor of alkali atoms to interact with the laser light.

DETAILED DESCRIPTION OF VARIOUS EXAMPLES

Figure 1:
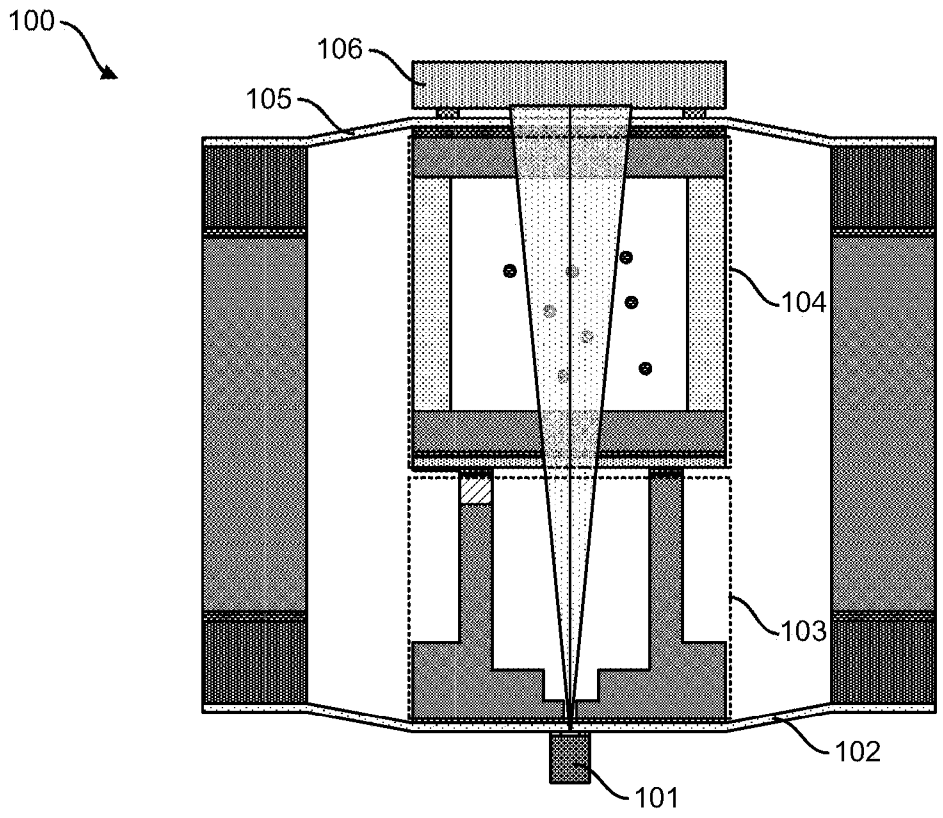
(Prior Art) FIG. 1
FIG. 1 shows a schematic of a physics package for chip scale atomic clocks according to the prior art.

Reference will now be made in detail to the following various examples, which are illustrated in the accompanying drawings, wherein like reference numerals refer to like elements throughout. The following examples may be embodied in various forms without being limited to the examples set forth herein.

Chip scale atomic clocks (CSACs) may represent an advancement in timing technology, offering atomic-quality precision in a compact, portable form. These devices may be valuable in applications requiring reliable timing in battery-powered equipment, such as telecommunications, navigation, and various consumer electronics. Despite their potential, the widespread adoption of CSACs may be hindered by several manufacturing challenges.

The current design of CSACs may involve encapsulating atoms within a microfabricated cell. A laser beam may be directed through this cell, where it interacts with atoms in a phenomenon called coherent population trapping (CPT) resonance. This interaction may generate a measurable light signal, which may be detected by a photodetector. The precision of this measurement may directly correlate to the clock's accuracy and reliability.

However, the manufacturing process for these devices may present several limitations. The miniaturization for chip-scale designs may lead to uneven temperature distribution within the cell, which may adversely affect the performance of the atomic interactions. Additionally, the complexity of the fabrication process may result in low throughput, high production costs, and poor yield rates, all of which hinder the economic viability of CSACs for broader applications.

As the demand for precise timing solutions continues to grow, there may exist a need for innovations that address these manufacturing limitations. Therefore, a method or apparatus for manufacturing CSACs that lowers costs, increases throughput, improves overall performance, and enhances yield may be needed.

FIG. 1 shows a schematic of a physics package 100 for chip scale atomic clocks according to the prior art. As shown in FIG. 1, the physics package 100 may include, among other components, a laser source 101, a first suspension 102, a machined part 103, an atomic cell 104, a second suspension 105, and a photodetector 106. The laser source 101 may be used to illuminate the atomic cell 104. The laser source 101 may provide laser light for inducing coherent population trapping (CPT) resonance in atoms. The first suspension 102 and the second suspension 105 may isolate the atomic cell 104 and optical components (not shown in FIG. 1) from vibrations and help maintain alignment. Optical components (e.g., lenses, beam splitters, and mirrors) may help direct and focus the laser light onto the atomic cell 104 and manage the laser light that exits the atomic cell 104.

The machined part 103 may be composed of an aluminum material. The machined part 103 may be bonded to the first suspension 102 using a type of adhesive or resin, such as epoxy. The machined part 103 may also be bonded to a bottom surface of the atomic cell 104 using epoxy. A top surface of the atomic cell 104 may be bonded to the second suspension 105 using epoxy. The use of epoxy in the assembly process of the physics package 100 involves more manual work and precision, which may lead to misalignment errors. The use of epoxy in the assembly process of the physics package 100 may also cause vacuum failure due to outgassing or bubbles. Furthermore, the use of small, machined parts, such as the machined part 103, in the physics package 100 may be costly.

The photodetector 106 may be positioned to measure the intensity of the laser light after it has interacted with the atoms encapsulated by the atomic cell 104. The photodetector 106 may capture the signal used to determine the frequency of the atomic transitions. According to one or more examples, a chip scale atomic clock may include the physics package 100, control electronics, a frequency reference, without limitation. The control electronics may include circuitry and software for managing the light frequency, processing the signals from the photodetector 106, and ensuring the chip scale atomic clock maintains accurate timing. The frequency reference may stabilize the frequency of the laser light based on the atomic resonance to ensure that the chip scale atomic clock remains accurate over time.

Figure 2:
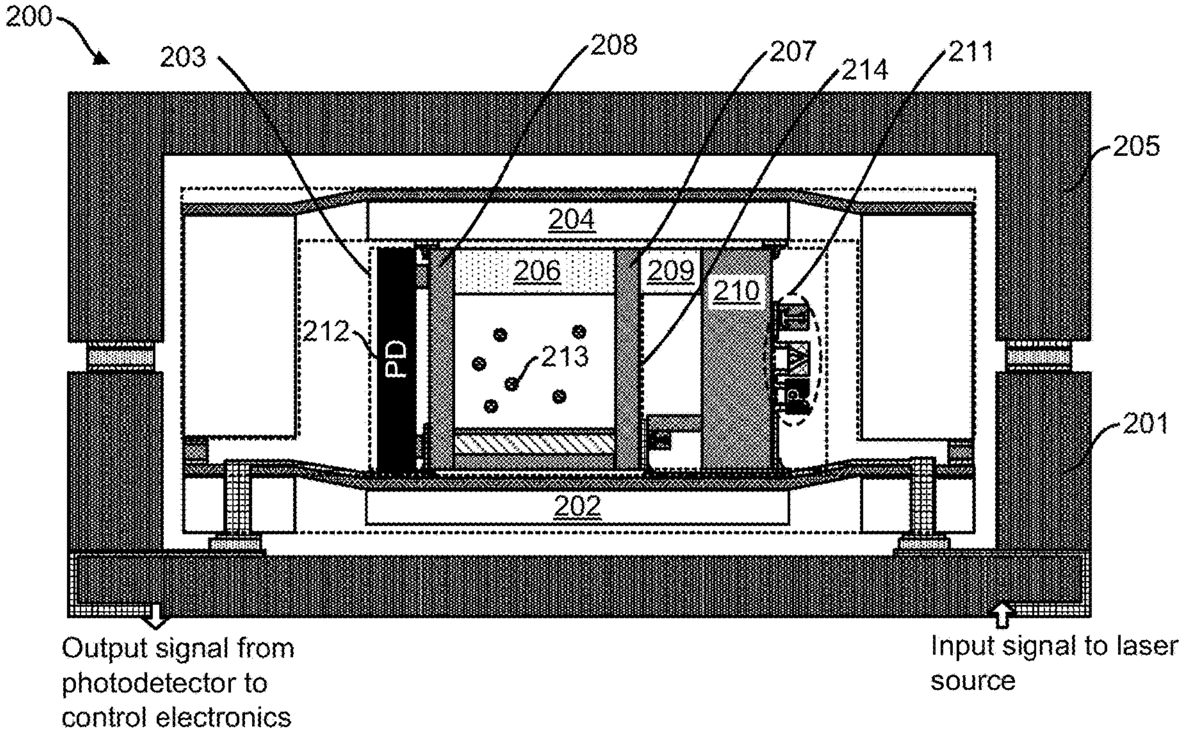
FIG. 2 shows a schematic of a physics package for chip scale atomic clocks according to one or more examples.

FIG. 2 shows a schematic of a physics package 200 for chip scale atomic clocks according to one or more examples. As shown in FIG. 2, the physics package 200 may include, among other components, a first Low-Temperature Co-fired Ceramic (LCC) pad 201, a first suspension 202 coupled to the first LCC pad 201, a core 203 coupled to the first suspension 202, a second suspension 204 coupled to the core 203 and coupled to the first suspension 202 to encapsulate the core 203, and a second LCC pad 205 coupled to the second suspension 204 and coupled to the first LCC pad 201 to encapsulate the first suspension 202, the core 203, and the second suspension 204.

The first LCC pad 201 and the second LCC pad 205 may house components of the physics package 200. For example, the first LCC pad 201 and the second LCC pad 205 may house the first suspension 202, the core 203, and the second suspension 204. The first LCC pad 201 and the second LCC pad 205 may be composed of materials that can withstand varying temperatures to maintain the performance of the physics package 200 under different operating conditions. The first LCC pad 201 and the second LCC pad 205 may have a ceramic structure to provide durability and protection for the components inside the physics package 200. The first LCC pad 201 and the second LCC pad 205 may allow for a smaller form factor of the physics package 200. The first LCC pad 201 and the second LCC pad 205 may facilitate the integration of multiple components into a single package, streamlining the design and manufacturing process of the physics package 200 (described in FIGS. 3A and 3B below). The first LCC pad 201 and the second LCC pad 205 may include features for efficient electrical connections.

The first suspension 202 and the second suspension 204 may be used to isolate atomic components of the physics package 200 from external vibrations and disturbances to maintain accuracy and stability of the physics package 200. For example, the first suspension 202 and the second suspension 204 may isolate the core 203. The first suspension 202 and the second suspension 204 may reduce the impact of external vibrations from the environment, which can affect the stability of the atomic transition frequencies used for timekeeping. The first suspension 202 and the second suspension 204 may aid in maintaining a stable temperature for the atomic components. The first suspension 202 and the second suspension 204 may provide a stable platform to help reduce mechanical noise and movement, allowing for more precise measurements of atomic interactions. The first suspension 202 and the second suspension 204 may contribute to long-term frequency stability for accurate timekeeping. According to one or more examples, the first suspension 202 and the second suspension 204 may be constructed using flexible electronic technology. For example, the first suspension 202 and the second suspension 204 may bend, stretch, or conform to various shapes and surfaces. The use of flexible electronic technology to construct the first suspension 202 and the second suspension 204 may reduce costs. The first suspension 202 and the second suspension 204 may be composed of materials like organic semiconductors, polymers, and thin-film metals. According to one or more examples, at least one of the first suspension 202 and the second suspension 204 is made of polyimide. According to one or more examples, the first suspension 202 includes thin polyimide films. According to one or more examples, the second suspension 204 includes a thin polyimide sheet in a middle of a top surface of the second suspension 204.

The core 203 may include a first silicon wafer 206, a first glass wafer 207 bonded to the first silicon wafer 206, a second glass wafer 208 bonded to the first silicon wafer 206, a second silicon wafer 209 bonded to the first glass wafer 207, a third glass wafer 210 bonded to the second silicon wafer 209, a laser source 211 attached to the third glass wafer 210, and a photodetector wafer (PD) 212 bonded to the second glass wafer 208. According to one or more examples, the wafers of the core 203 may be bonded using anodic (or electrostatic) bonding. According to one or more examples, at least one of the first silicon wafer 206 and the second silicon wafer 209 may undergo a Deep Reactive Ion Etching (DRIE) process.

According to one or more examples, the bonded first silicon wafer 206, first glass wafer 207, and second glass wafer 208 may form an atomic cell that contains a vapor of alkali atoms 213 to interact with the laser light. According to one or more examples, the alkali atoms 213 may be cesium, rubidium, or lithium, though other types of atoms may also be used. The atomic cell may serve as the medium where the atomic transitions occur, allowing the physics package 200 to measure time based on the resonant frequencies of the alkali atoms 213. The atomic cell may provide the alkali atoms 213 for the physics package's 200 operation. Laser light from the laser source 211 may interact with the alkali atoms 213 in the atomic cell, facilitating excitation and detection by the photodetector 212. The design of the atomic cell may influence temperature and pressure to help maintain stable conditions for accurate measurements.

According to one or more examples, the core 203 may be arranged along a horizontal axis in the physics package 200. Such an arrangement may reduce a vertical height of the physics package 200. According to one or more examples, the laser source 211 may be a compact, tunable diode laser. For example, the laser source 211 may be a Vertical Cavity Surface Emitting Laser (VCSEL). The VCSEL may be designed with a compact optical cavity to increase output efficiency and beam quality. In addition to the VCSEL (V), the laser source 211 may also include a thermistor (T) to measure the laser temperature, and a photodetector (P) to measure laser output power. The power of the laser source 211 output may be configured to excite the atomic transitions. For example, higher power may increase the interaction rate with alkali atoms 213, improving signal-to-noise ratios in measurements by the photodetector 212. The temperature of the laser source 211 may be controlled to directly affect the laser light wavelength and stability. The laser source 211 may use thermoelectric coolers (TECs) for precise temperature regulation. According to one or more examples, an input signal (e.g., operating voltage) is supplied to the laser source 211 through the first LCC pad 201.

The photodetector 212 may measure the intensity of the laser light that has interacted with the vapor of the alkali atoms 213 in the atomic cell. This laser light may be transmitted or reflected after interacting with the alkali atoms 213. As the laser light passes through the vapor of the alkali atoms 213 in the atomic cell, certain wavelengths may be absorbed by the alkali atoms 213 at specific resonance frequencies. The photodetector 212 may detect the reduction in light intensity due to this absorption, which is indicative of the atomic transitions occurring within the atomic cell. The photodetector 212 may convert the optical signal (e.g., the measured intensity of the laser light) into an output signal. This conversion may be necessary for further processing and analysis by the control electronics (not shown in FIG. 2) of the chip scale atomic clock. According to one or more examples, the output signal is supplied from the photodetector 212 to control electronics through the first LCC pad 201. The control electronics may determine a frequency of atomic transitions. The output signal generated by the photodetector 212 may be used in feedback loops to stabilize the laser frequency. By comparing the output signal with a reference, the control electronics may adjust the laser frequency to maintain resonance with the atomic transitions. The output signal may undergo additional processing to filter noise and enhance signal quality.

According to one or more examples, at least one of the first glass wafer 207 and the third glass wafer 210 may include a metasurface optical component 214. According to one or more examples, the metasurface optical component 214 may convert the laser light from a Gaussian beam to a flat-top beam or a beam with a more uniform intensity. This conversion may improve the interaction between the laser light and the alkali atoms 213, and potentially improve the noise performance of the chip scale atomic clock. The metasurface optical component 214 may be a two-dimensional structure composed of an array of subwavelength optical elements, or meta-atoms. According to one or more examples, the metasurface optical component 214 may be tuned to manipulate at least one of a phase, wavelength, amplitude, and polarization of the laser light. For example, the metasurface optical component 214 may circularly polarize and collimate the laser light. The metasurface optical component 214 may control light at a much finer scale than traditional optics. Geometric properties of the meta-atoms of the metasurface optical component 214 may be varied to control the phase of the incoming Gaussian beam from the laser source 211. This phase manipulation may allow for the shaping of the beam profile. The metasurface optical component 214 may transform a Gaussian beam, characterized by a high intensity at the center and a rapid falloff towards the edges, into a flat-top beam with a more uniform intensity across a specified area. This may be advantageous for atomic interactions so that the alkali atoms 213 in atomic cell may be illuminated more evenly. A flat-top beam may more uniformly excite the alkali atoms 213 across the atomic cell, improving coherence and effectiveness of atomic transitions. The more uniform intensity may also help to enhance the signal quality in the detection process by the photodetector 212, leading to better performance of the physics package 200. The metasurface optical component 214 may achieve this conversion with high efficiency and compactness compared to traditional optics.

Figure 3:
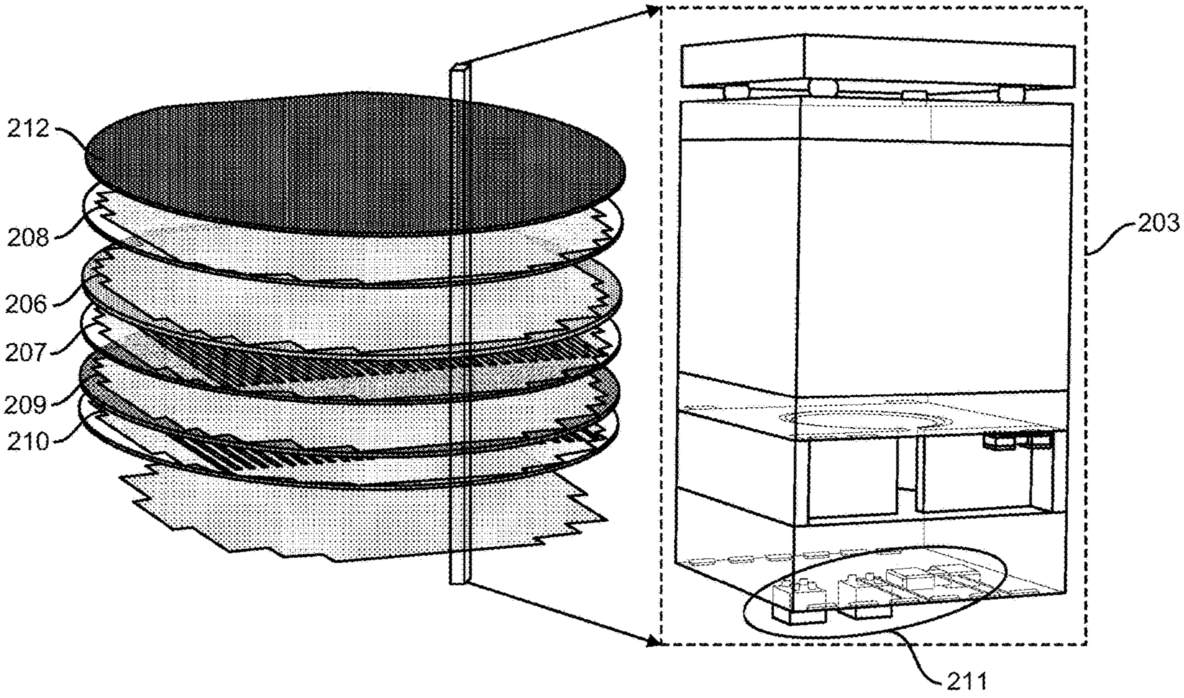
FIG. 3 shows a schematic of a core of a physics package for chip scale atomic clocks according to FIG. 2.

FIG. 3 shows a schematic of the core 203 of the physics package 200 for chip scale atomic clocks according to FIG. 2. As shown in FIG. 3 (and discussed above in FIG. 2), the core 203 may include a first silicon wafer 206, a first glass wafer 207 bonded to the first silicon wafer 206, a second glass wafer 208 bonded to the first silicon wafer 206, a second silicon wafer 209 bonded to the first glass wafer 207, a third glass wafer 210 bonded to the second silicon wafer 209, a laser source 211 attached to the third glass wafer 210, and a photodetector wafer 212 bonded to the second glass wafer 208. According to one or more examples, the wafers of the core 203 may be bonded using anodic (or electrostatic) bonding. According to one or more examples, at least one of the first silicon wafer 206 and the second silicon wafer 209 may undergo a Deep Reactive Ion Etching (DRIE) process.

Figure 4A:
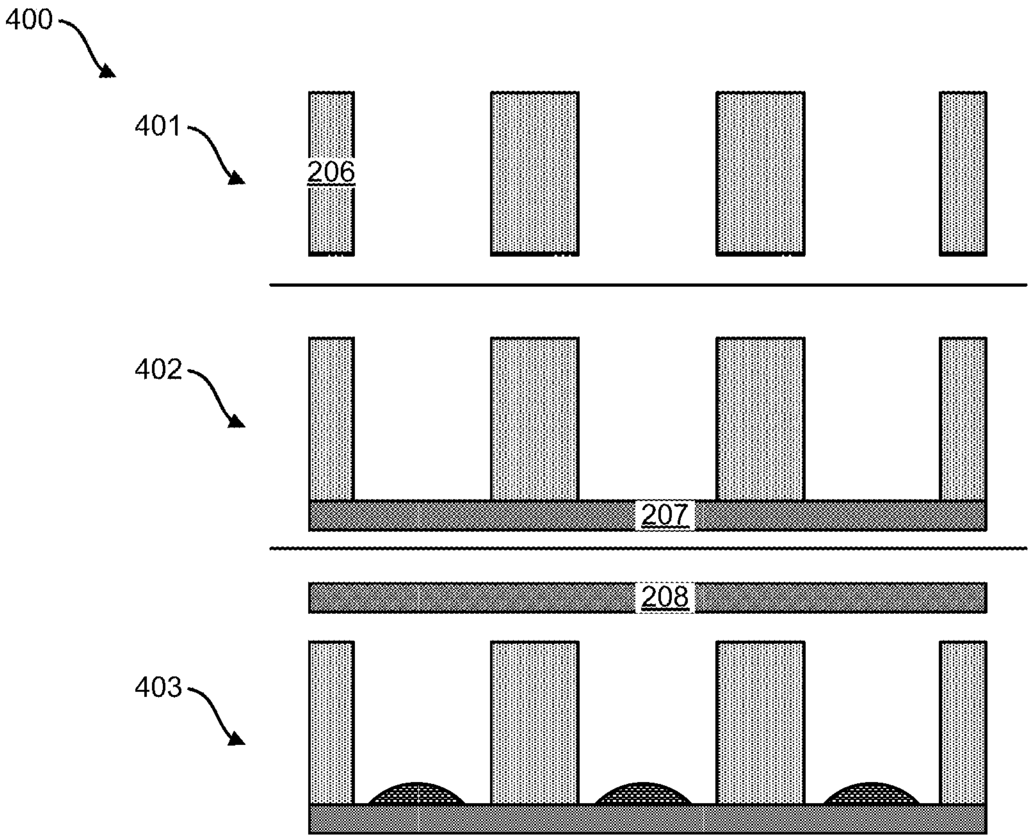
FIGS. 4A and 4B show a fabrication process for manufacturing a core of a physics package for chip scale atomic clocks according to FIG. 2.
Figure 4B:
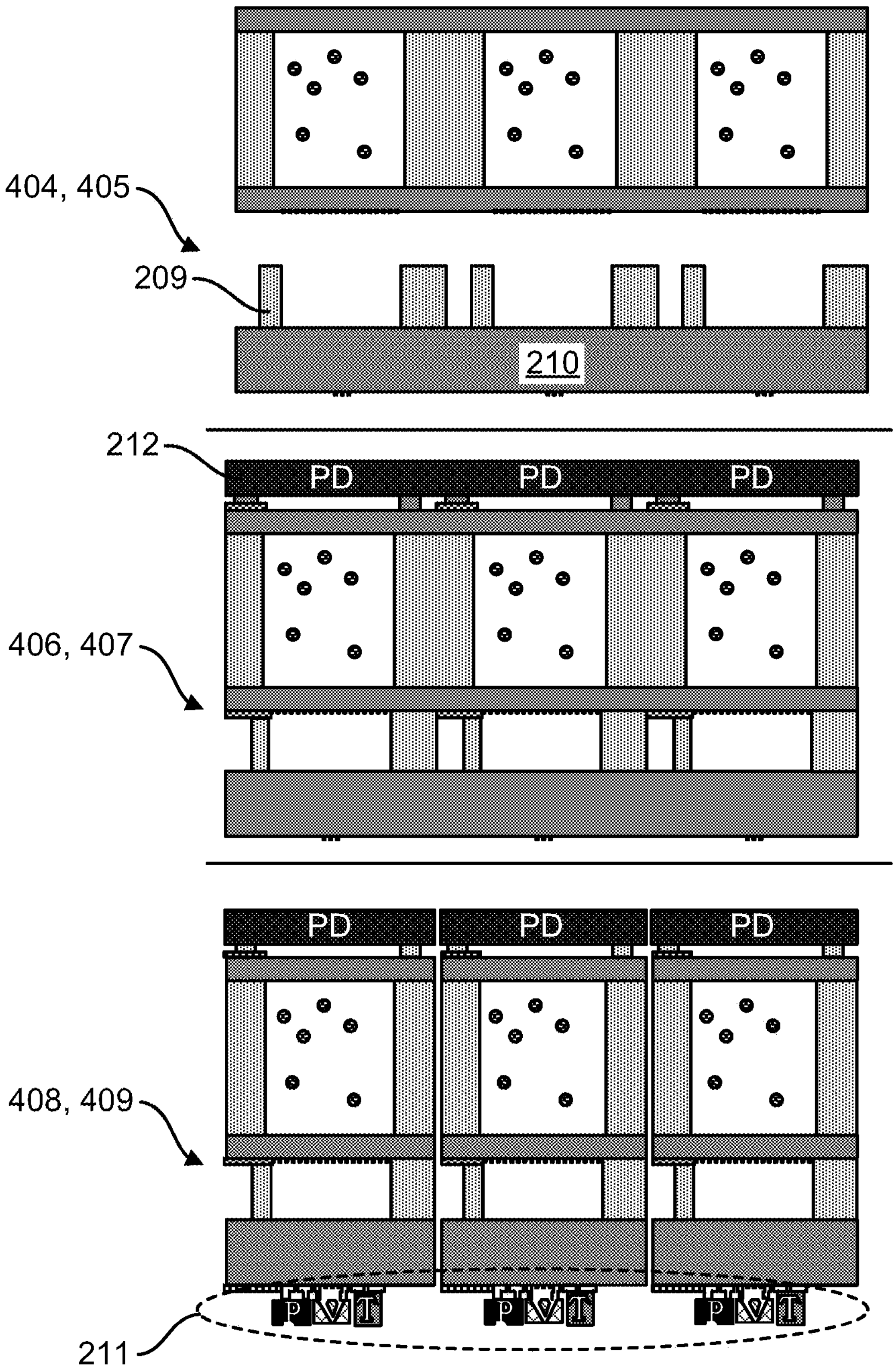

FIGS. 4A and 4B show a fabrication process 400 for manufacturing the core 203 of the physics package 200 for chip scale atomic clocks according to FIG. 2. As shown in FIG. 4A, in the fabrication process 400, operation 401 may include etching the first silicon wafer 206 to create specific patterns or features. Operation 402 may include bonding the first silicon wafer 206 to the first glass wafer 207. Following this, operation 403 may include bonding the second glass wafer 208 to the opposite side of the first silicon wafer 206.

As shown in FIG. 4B, operation 404 may include etching the second silicon wafer 209 to define additional structural features. Subsequently, operation 405 may include bonding the etched second silicon wafer 209 to the third glass wafer 210. In operation 406, the second silicon wafer 209 may be bonded to the first glass wafer 207, forming a multi-layered stack. Operation 407 may include adding the photodetector wafer 212, bonded to the second glass wafer 208 to enable detection functionality. In operation 408, the laser source 211 may be attached to the third glass wafer 210, the laser source 211 configured to emit laser light necessary for the core's 203 operation. Finally, operation 409 may involve dicing the assembled and bonded silicon and glass wafers into individual core units.

Figure 5A:
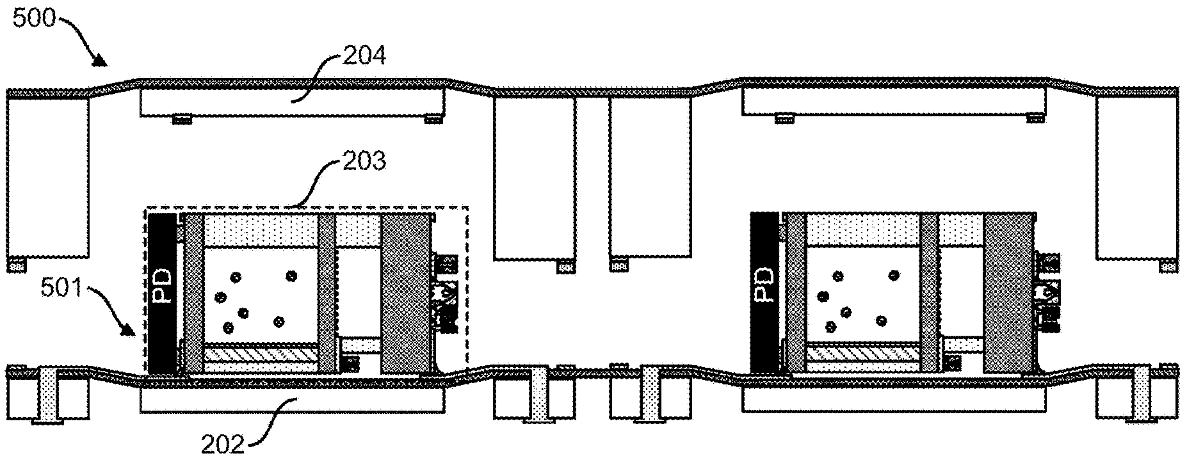
FIGS. 5A and 5B show a fabrication process for manufacturing a physics package for chip scale atomic clocks according to FIG. 2.
Figure 5B:
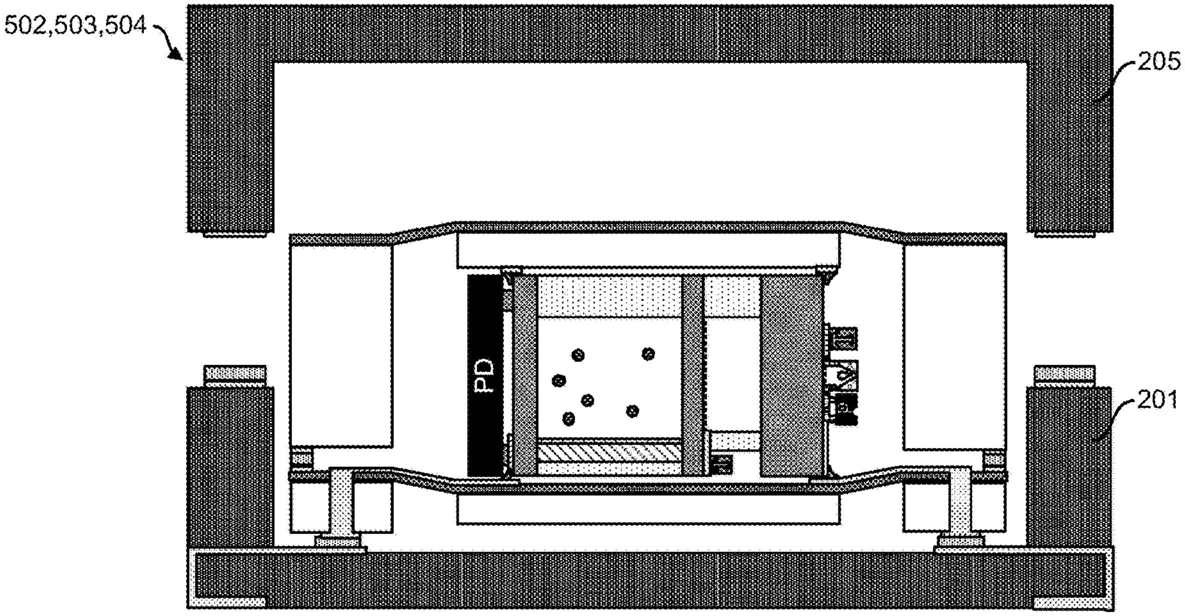

FIGS. 5A and 5B show a fabrication process 500 for manufacturing the physics package 200 for chip scale atomic clocks according to FIG. 2. As shown in FIG. 5A, the fabrication process 500 begins with operation 501, which may involve positioning the cores 203 between the first suspension 202 and the second suspension 204 to create suspended cores. In operation 502, these suspended cores may be disposed onto the first LCC pad 201. As shown in FIG. 5B, operation 503 follows, which may include coupling the second LCC pad 205 to the first LCC pad 201 to form a unified assembly. Finally, operation 504 may include dicing the bonded first and second LCC pads 201, 205 into individual physics package units, completing the manufacturing process.

Various examples have been disclosed herein, in connection with the above description and the drawings. It will be understood that it would be unduly repetitious to literally describe and illustrate every combination and subcombination of these examples. Accordingly, all examples can be combined in any way or combination, and the present specification, including the drawings, shall be construed to constitute a complete written description of all combinations and subcombinations of the examples described herein, and of the manner and process of making and using them, and shall support claims to any such combination or subcombination.

It will be appreciated by persons skilled in the art that the examples described herein are not limited to what has been particularly shown and described herein above. In addition, unless mention was made above to the contrary, it should be noted that all of the accompanying drawings are not to scale. A variety of modifications and variations are possible in light of the above teachings.

What is claimed is:

1. A physics package for chip scale atomic clocks, comprising:
- a first Low-Temperature Co-fired Ceramic (LCC) pad;
- a first suspension coupled to the first LCC pad;
- a core coupled to the first suspension, the core comprising:
  - a first silicon wafer;
  - a first glass wafer bonded to the first silicon wafer;
  - a second glass wafer bonded to the first silicon wafer;
  - a second silicon wafer bonded to the first glass wafer;
  - a third glass wafer bonded to the second silicon wafer such that the second silicon wafer is disposed between the first glass wafer and the third glass wafer;
  - a laser source attached to the third glass wafer, wherein the laser source is to emit laser light; and
  - a photodetector wafer bonded to the second glass wafer, wherein the photodetector wafer is to output an output signal based on a measured intensity of the laser light;
- a second suspension coupled to the core and coupled to the first suspension to encapsulate the core; and
- a second LCC pad coupled to the second suspension and coupled to the first LCC pad to encapsulate the first suspension, the core, and the second suspension,
- wherein the core is manufactured using a wafer level fabrication process.

2. The physics package of claim 1, wherein at least one of the first suspension and the second suspension are constructed using flexible electronic technology.

3. The physics package of claim 1, wherein at least one of the first suspension and the second suspension is made of polyimide.

4. The physics package of claim 3, wherein the second suspension includes a thin polyimide sheet in a middle of a top surface of the second suspension.

5. A core of a physics package for chip scale atomic clocks, comprising:
- a first silicon wafer;
- a first glass wafer bonded to the first silicon wafer;
- a second glass wafer bonded to the first silicon wafer;
- a second silicon wafer bonded to the first glass wafer;
- a third glass wafer bonded to the second silicon wafer such that the second silicon wafer is disposed between the first glass wafer and the third glass wafer;
- a laser source attached to the third glass wafer, wherein the laser source is to emit laser light; and
- a photodetector wafer bonded to the second glass wafer, wherein the photodetector wafer is to output an output signal based on a measured intensity of the laser light.

6. The core of claim 5, wherein the physics package is arranged along a horizontal axis in the chip scale atomic clock.

7. The core of claim 5, wherein the laser source is a Vertical Cavity Surface Emitting Laser (VCSEL).

8. The core of claim 5, wherein an input signal is supplied to the laser source through a LCC pad, and
- wherein the output signal is supplied from the photodetector wafer to control electronics through the LCC pad, wherein the control electronics is to determine a frequency of atomic transitions.

9. The core of claim 5, wherein at least one of the first glass wafer and the third glass wafer includes a metasurface optical component.

10. The core of claim 9, wherein the metasurface optical component converts the laser light from a Gaussian beam to a flat-top beam.

11. The core of claim 9, wherein the metasurface optical component can be tuned to manipulate at least one of a phase, wavelength, amplitude, and polarization of the laser light.

12. The core of claim 5, wherein the bonded first silicon wafer, first glass wafer, and second glass wafer form an atomic cell that contains a vapor of alkali atoms to interact with the laser light.

13. The core of claim 12, wherein the alkali atoms are cesium, rubidium, or lithium.

14. A method of manufacturing a core of a physics package for chip scale atomic clocks, comprising:
- etching a first silicon wafer;
- bonding the first silicon wafer to a first glass wafer;
- bonding a second glass wafer to the first silicon wafer;
- etching a second silicon wafer;
- bonding the second silicon wafer to a third glass wafer;
- bonding the second silicon wafer to the first glass wafer;
- bonding a photodetector wafer to the second glass wafer;
- attaching a laser source to the third glass wafer, the laser source to emit laser light; and dicing the bonded silicon and glass wafers into individual physics package units.

15. The method of claim 14, wherein the core is arranged along a horizontal axis in the physics package.

16. The method of claim 14, wherein the second silicon wafer is bonded to the first glass wafer such that the second silicon wafer is disposed between the first glass wafer and the third glass wafer.

17. The method of claim 14, wherein at least one of the first glass wafer and the third glass wafer includes a metasurface optical component.

18. The method of claim 17, wherein the metasurface optical component converts the laser light from a Gaussian beam to a flat-top beam.

19. The method of claim 17, wherein the metasurface optical component can be tuned to manipulate at least one of a phase, wavelength, amplitude, and polarization of the laser light.

20. The method of claim 14, wherein the bonded first silicon wafer, first glass wafer, and second glass wafer form an atomic cell that contains a vapor of alkali atoms to interact with the laser light.

* * * * *